United States Patent
Seong et al.

(10) Patent No.: US 7,740,364 B2
(45) Date of Patent: Jun. 22, 2010

(54) BACKLIGHT UNIT AND LIQUID CRYSTAL DISPLAY DEVICE EMPLOYING THE SAME

(75) Inventors: Ki-bum Seong, Anyang-si (KR); Il-yong Jung, Suwon-si (KR); Tae-hee Cho, Seoul (KR); Jong-min Wang, Seongnam-si (KR); Jin-kyoung Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/293,227

(22) Filed: Dec. 5, 2005

(65) Prior Publication Data

US 2006/0221629 A1 Oct. 5, 2006

(30) Foreign Application Priority Data

Apr. 4, 2005 (KR) .................... 10-2005-0028068

(51) Int. Cl.
*G09F 13/08* (2006.01)

(52) U.S. Cl. .................... 362/97.3; 362/97.1; 362/243; 362/328

(58) Field of Classification Search ................ 362/561, 362/600, 608, 609, 610, 612, 621, 623, 625, 362/555, 559, 33, 97, 97.1, 97.2, 97.3, 97.4, 362/125, 153.1, 227, 230, 231, 240, 276, 362/279, 290, 326, 327, 330, 328, 346, 349, 362/800, 812; 345/82, 83, 87, 99; 349/58, 349/61, 62, 65, 66, 68, 69; 40/541, 542, 40/546, 547, 564, 563, 565, 581, 582

See application file for complete search history.

(56) References Cited

U.S. PATENT DOCUMENTS

| 4,390,810 | A | * | 6/1983 | Biwa | 313/500 |
| 5,390,093 | A | * | 2/1995 | Himeno et al. | 362/249 |
| 5,819,454 | A | * | 10/1998 | Rosenitsch | 40/452 |
| 5,836,676 | A | | 11/1998 | Ando et al. | |
| 7,152,988 | B2 | * | 12/2006 | Hung | 362/97 |

FOREIGN PATENT DOCUMENTS

| CN | 1321912 A | 11/2001 |
| CN | 1553257 A | 12/2004 |
| CN | 1564067 A | 1/2005 |
| JP | 05275747 A | * 10/1993 |

(Continued)

OTHER PUBLICATIONS

English translation of the Japanese Patent No. JP 410010997 A (Kurematsu) provided by the Advanced Industrial Property Network (AIPN) of the Japanese Patent Office.*

*Primary Examiner*—Hargobind S Sawhney
(74) *Attorney, Agent, or Firm*—Sughrue Mion, PLLC

(57) ABSTRACT

A direct light type backlight unit having a structure in which divided luminance areas are sequentially turned on and off and a liquid crystal display device employing the backlight unit are provided. The backlight unit includes: a base substrate; a plurality of point light sources arranged in a plurality of lines and mounted on the base substrate; and a reflector sheet vertically formed between lines of the point light sources, reflecting light emitted from the point light sources.

20 Claims, 5 Drawing Sheets

FOREIGN PATENT DOCUMENTS

| | | |
|---|---|---|
| JP | 10-10997 A | 1/1998 |
| JP | 2002-072167 A | 3/2002 |
| JP | 2002072167 A * | 3/2002 |
| JP | 2002-244574 A | 8/2002 |
| JP | 2004-200139 A | 7/2004 |
| KR | 10-2004-0057383 A | 7/2004 |

* cited by examiner

BACKLIGHT UNIT AND LIQUID CRYSTAL DISPLAY DEVICE EMPLOYING THE SAME

CROSS-REFERENCE TO RELATED PATENT APPLICATION

This application claims priority from Korean Patent Application No. 10-2005-0028068, filed on Apr. 4, 2005, in the Korean Intellectual Property Office, the disclosure of which is incorporated herein in its entirety by reference.

BACKGROUND OF THE INVENTION

1. Field of the Invention

The present invention relates to a backlight unit and a liquid crystal display device employing the same and, more particularly, to a direct light type backlight unit having a structure in which divided luminance areas are sequentially turned on and off and a liquid crystal display device employing the backlight unit.

2. Description of the Related Art

A liquid crystal display (LCD), which is one type of flat panel display, is a passive display that forms an image without using self-luminescence but instead using incident light from the outside. A backlight unit is disposed at a rear of the LCD to irradiate light toward the liquid crystal panel.

A cold cathode fluorescence lamp (CCFL) is generally used as a light source for backlight units. However, the CCFL has a comparatively short lifespan and inferior color reproducibility. It is also impossible instantly to turn on the CCFL. Therefore, when a backlight unit using the CCFL is divided into a plurality of luminance areas, the luminance areas cannot be sequentially turned on in synchronization with a screen scanning of a liquid crystal device. Hence, it is difficult effectively to prevent a motion blur in which after-images remain when an image frame is transferred to another image frame in a liquid crystal display device.

To overcome such drawbacks of the CCFL, a backlight unit using a point light source, such as a light emitting diode (LED), recently has been developed instead of the CCFL. Examples of such a backlight unit are disclosed in Korea Patent Application No. 10-2003-0019834, entitled "STRUCTURE OF BACKLIGHT UNIT FOR LIQUID CRYSTAL DISPLAY", and Korea Patent Application No. 10-2003-0023052, entitled "STRUCTURE OF BACKLIGHT UNIT FOR LIQUID CRYSTAL DISPLAY".

In Korea Patent Application No. 10-2003-0019834, a light guide panel is divided into a plurality of divided blocks, and a light emitting diode is mounted on each side of the divided blocks. Groove-shaped boundary regions corresponding to the boundaries between divided blocks are formed on a rear side of the light guide plate, and thus leaking of light emitted from the LED into adjacent blocks is prevented. Meanwhile, in Korea Patent Application No. 10-2003-0023052, a light guide plate is also divided into a plurality of blocks, and an LED is mounted at a side surface of each of the divided blocks. However, instead of forming a groove at a boundary between divided blocks of the light guide panel, each of the divided blocks is formed to have a refractive index decreasing from a central part to a boundary part for preventing the light emitted from the LED from leaking into adjacent blocks.

However, the above mentioned conventional backlight units are edge light type backlight units in which a light source is mounted at an edge of a light guide panel (LGP) and light emitted from the light source is transferred to a liquid crystal panel. The edge light type backlight unit has a difficulty to transfer uniformly the light to the liquid crystal panel and has a degraded light efficiency. When the LGP is divided into a plurality of blocks and the blocks sequentially emit light, it is important to prevent light emitted from a block from leaking into adjacent blocks. However, the conventional backlight units are not able perfectly to prevent light leakage. Particularly, when the refractive index of each block of the light guide panel gradually changes over the block, there must be large light loss in the block and a manufacturing cost of the light guide panel increases. Also, a comparatively large amount of light leaks into the adjacent areas.

SUMMARY OF THE INVENTION

The present invention provides a direct light type backlight unit having an improved structure in which divided luminance areas are sequentially turned on and off, and a liquid crystal display employing the backlight unit.

The present invention also provides a direct light type backlight unit which has superior color reproducibility and a comparatively longer lifespan and in which a plurality of divided luminance areas can be sequentially and instantly turned on and off in synchronization with a screen scanning of a liquid crystal display panel, and light diffusion into adjacent luminance areas is perfectly prevented, and a liquid crystal display device employing the same.

According to an aspect of the present invention, there is provided a backlight unit including: a base substrate; a plurality of point light sources arranged in a plurality of lines and mounted on the base substrate; and a reflector sheet, vertically disposed over the base substrate between lines of the point light sources, which reflects light emitted from the point light sources.

The plurality of point light source lines may be sequentially turned on at predetermined time intervals.

The point light source lines may be repeatedly turned on and off in a regular cycle, and one line of point light sources may be turned on after a previous line of the point light sources is turned on and a predetermined time period has elapsed.

The point light sources may emit light vertically with respect to the base substrate.

The point light sources may include red light sources, green light sources and blue light sources and emit a white light and may be one of laser diodes and light emitting diodes.

The backlight unit may further include a diffusion panel which diffuses light emitted from the point light sources to generate a uniform transmitted light.

According to another aspect of the present invention, there is provided a liquid crystal display device having a liquid crystal display panel and a backlight unit arranged at a rear of the liquid crystal display panel for radiating light to the liquid crystal display panel, wherein the backlight unit includes: a base substrate; a plurality of point light sources arranged in a plurality of lines and mounted on the base substrate; and a reflector sheet vertically disposed over the base substrate between lines of the point light sources, which reflects light emitted from the point light sources.

Each of the point light source lines may be turned on in synchronization with a screen scanning of the liquid crystal display panel.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1A:
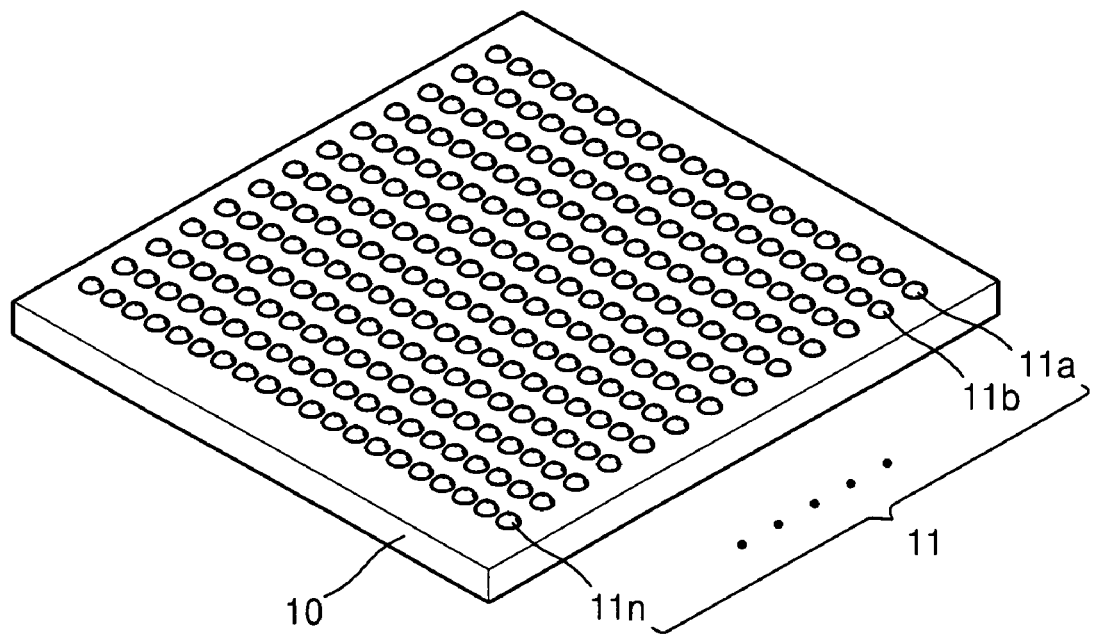
FIG. 1A illustrates an arrangement of light emitting diodes (LED) in a direct light type backlight unit according to an embodiment of the present invention.
Figure 1B:
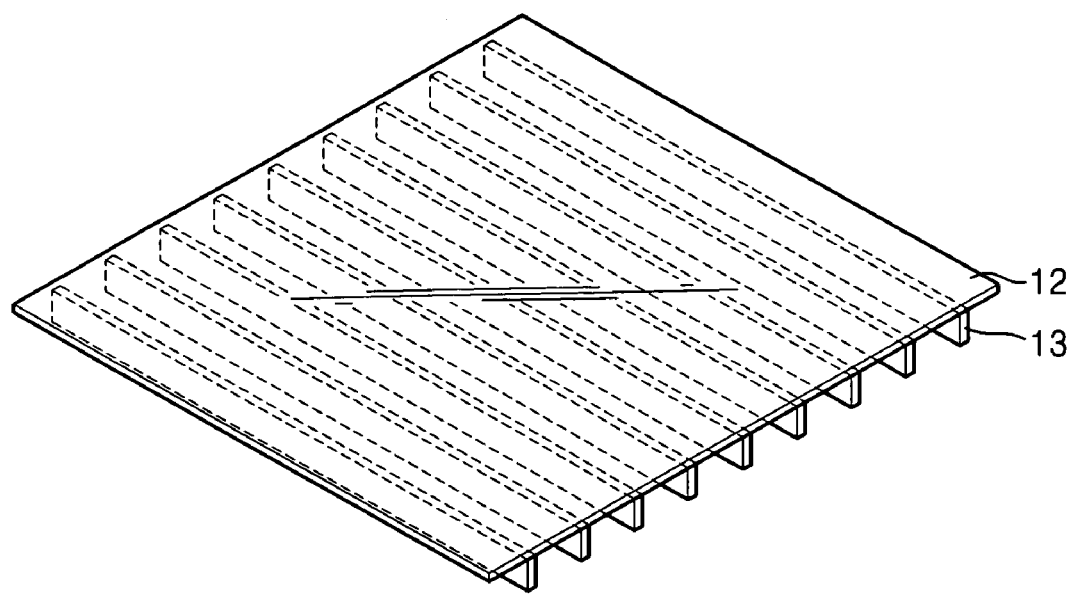
FIG. 1B illustrates a diffusion plate having barrier walls in a backlight unit according to an embodiment of the present invention.

FIG. 1A is a perspective view of a base substrate 10 in a direct light type backlight unit according to an embodiment of the present invention. FIG. 1B is a perspective view of a diffusion plate 12 in the backlight unit according to an exemplary embodiment of the present invention.

As illustrated in FIGS. 1A and 1B, the direct light type backlight unit includes the base substrate 10, a plurality of point light sources 11 arranged in a plurality of lines, the diffusion plate 12 for generating a uniform transmitted light by diffusing light emitted from the point light sources 11, and a plurality of reflector sheets 13 vertically formed on the diffusion plate 12.

A laser diode (LD) or a light emitting diode (LED) may be used as the point light source 11. The point light sources 11, such as LDs or LEDs, provide better color reproducibility and a longer lifespan as compared to a rod light source using a cold cathode fluorescent lamp (CCFL). Especially, since the point light sources 11, such as the LDs or the LEDs can be instantly turned on and off, the backlight unit using the point light sources 11 made of the LDs or the LEDs can be turned on or off by synchronizing with a screen scanning time of the liquid crystal display device. Accordingly, the point light sources 11 are arranged on the base substrate 10 in a plurality of lines as shown in FIG. 1A. That is, the point light sources 11 are arranged in lines from a first point light source line 11a to an n-th point light source line 11n. The number of lines may be properly determined according to a size of a liquid crystal display panel on which the backlight unit is mounted. For example, a 26-inch LCD TV includes 768 lines of pixels in a longitudinal direction. If one line of point light sources is designed to illuminate 7 lines of pixels, 110 lines of point light sources are required. The point light sources 11 include three types of light sources emitting red (R), greed (G), and blue (B) light, so that a white light is vertically emitted.

As illustrated in FIG. 1B, a plurality of reflector sheets 13 are vertically mounted on the diffusion plate 12. When assembling the backlight unit according to the present embodiment, the plurality of reflector sheets 13 are arranged parallel to the lines of point light sources and between the lines of point light sources, and reflect light emitted from the point light sources 11. Accordingly, the reflector sheets 13 divide the backlight unit into a plurality of luminance areas and prevents light emitted from one luminance area from being diffused to adjacent luminance areas. Although the reflector sheets 13 are attached to the diffusion plate 12 in FIG. 1B, the reflector sheets 13 may be mounted on the base substrate 10.

Figure 2:
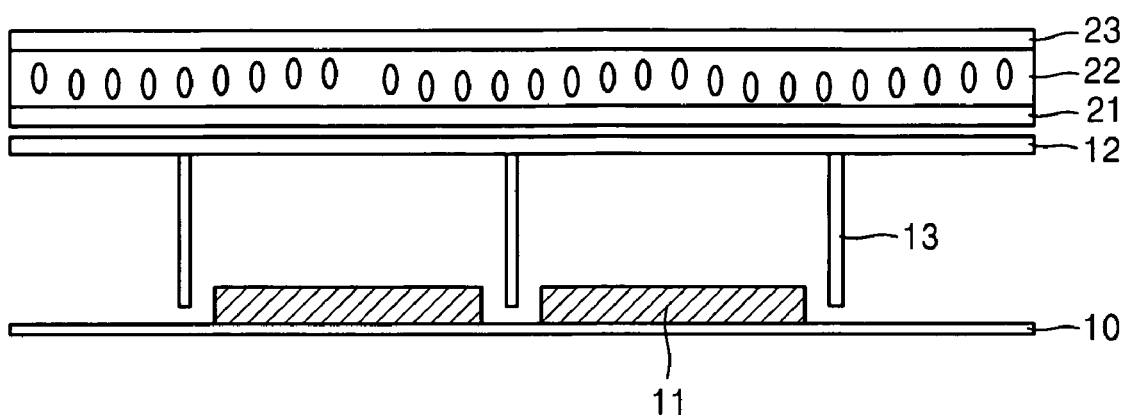
FIG. 2 is a cross-sectional view of a liquid crystal display device having the backlight unit according to the embodiment illustrated in FIGS. 1A and 1B.

FIG. 2 is a cross sectional view of a liquid crystal display device having the backlight unit illustrated in FIGS. 1A and 1B.

As illustrated in FIG. 2, the liquid crystal display device includes a liquid crystal panel and the backlight unit illustrated in FIGS. 1A and 1B arranged at a rear of the liquid crystal panel to radiate light onto the liquid crystal panel. As described above, the backlight unit includes the base substrate 10; the plurality of point light sources arranged in a plurality of lines on the base substrate 10, the diffusion panel 12 arranged in parallel to the base substrate 10, the reflector sheets 13 vertically mounted on areas of the diffusion panel 12 between lines of the point light sources 11. The liquid crystal panel includes a bottom glass 21, a top glass 23, and liquid crystal 22 injected between the bottom glass 21 and the top glass 23. The bottom glass 21 and the top glass 23 are sealed. Any type of liquid crystal panel may be used in the liquid crystal display device. Accordingly, a detailed explanation of a structure of the liquid crystal panel is omitted because it is well-known to those skilled in the art.

Hereinafter, an operation of the backlight unit having such a structure will be explained.

Figure 3A:
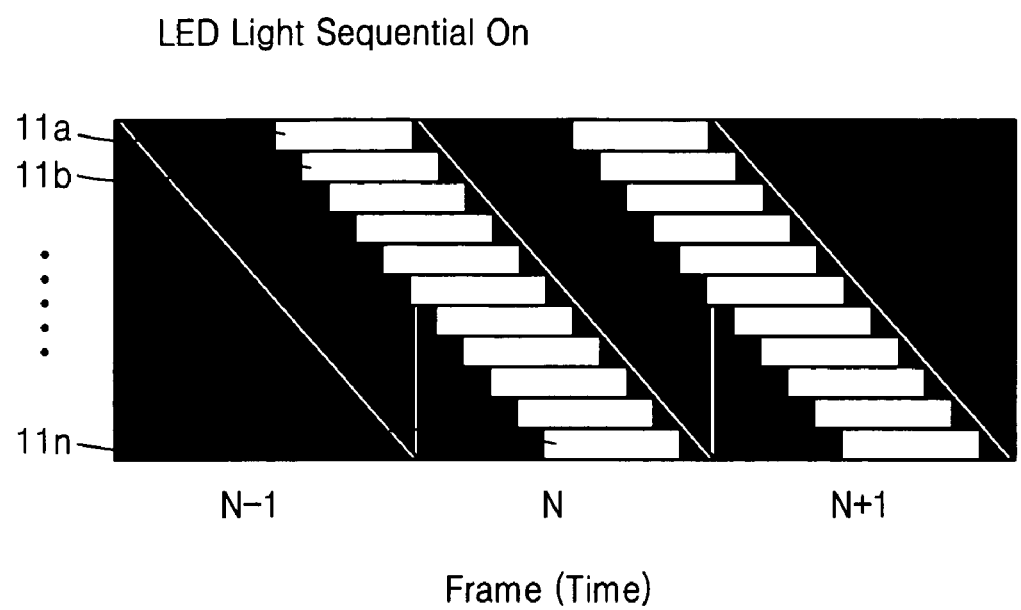
FIG. 3A illustrates a method of individually turning on point light source lines in the backlight unit according to the embodiment illustrated in FIGS. 1A and 1B.
Figure 3B:
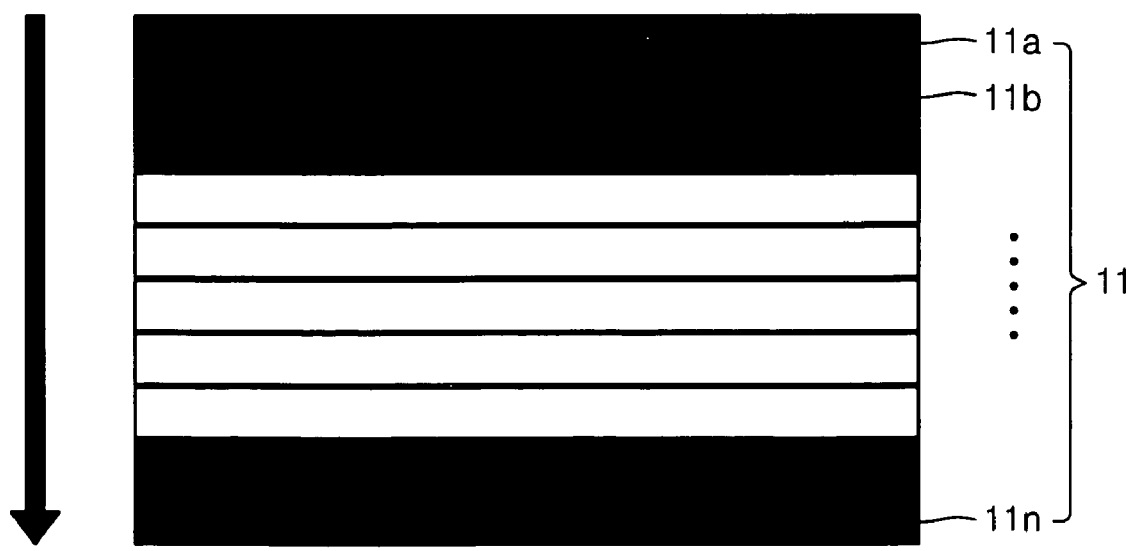
FIG. 3B illustrates the point light source lines which are individually turned-on in the backlight unit according to the embodiment illustrated in FIGS. 1A to 2.

FIG. 3A illustrates a method of sequentially turning on point light sources of divided luminance area in a backlight unit according to an embodiment of the present invention. FIG. 3B shows partially turned on point light source lines in a backlight unit according to an embodiment of the present invention.

In FIG. 3A, a horizontal axis represents a frame of a picture, that is, time, and a vertical axis indicates each line of point light sources in the backlight unit. Typically, an LCD TV screen is sequentially scanned from an upper portion of the screen to a bottom portion of the screen to form an image of one frame. The upper portion of the screen is re-scanned to form the next frame right before completing scanning the bottom portion of the screen. In case of a conventional backlight unit using a CCFL, the motion blur is not effectively eliminated since the entire surface of a liquid crystal panel is always illuminated regardless of areas of the liquid crystal panel scanned. In the present embodiment, the plurality of point light source lines 11a to 11n are sequentially turned on and off at a predetermined time interval by synchronizing with a scanning time of the liquid crystal panel. Therefore, the motion blur is effectively eliminated.

As illustrated in FIG. 3A, the first point light source line 11a is turned on at the moment when a picture of an $N^{th}$ frame is scanned on the upper portion of the liquid crystal panel. After a predetermined time has elapsed, the second point light source line 11b is turned on according to a scanning time of the liquid crystal panel. In this way, the lines 11a through 11n are sequentially turned on, so that illumination of the backlight unit for the $N^{th}$ frame image is completed. Each of the turned-on point light source lines is tuned off after a predetermined time has elapsed, and they are turned on again for forming an image of a next frame. That is, the point light source lines are repeatedly turned on and off in a predetermined cycle, and each of the point light source lines is controlled to be turned on after point light sources of a previous line are turned on and a predetermined time period has elapsed. The turning-on and off cycle of each of the point light source lines and a turning-on delay time between adjacent point light source lines depend upon a vertical scanning frequency of a liquid crystal panel and the number of point light source lines.

As described above, the point light source lines are sequentially turned on within a predetermined period in the backlight unit according to the present embodiment. Therefore, at an arbitrary time, only a portion of the backlight unit instead of the entire area thereof is turned on as illustrated in FIG. 3B.

Since the backlight unit must be partially emitted at an arbitrary time, the backlight unit needs to prevent light emitted from the turned-on luminance areas from being diffused to adjacent divided luminance areas that are not turned on. That is, one line of point light sources must not irradiate light to areas of adjacent lines of point light sources. In the present embodiment, the reflector sheets 13 prevent the light emitted from one point light source line to be diffused to areas of adjacent point light source lines.

Figure 4A:
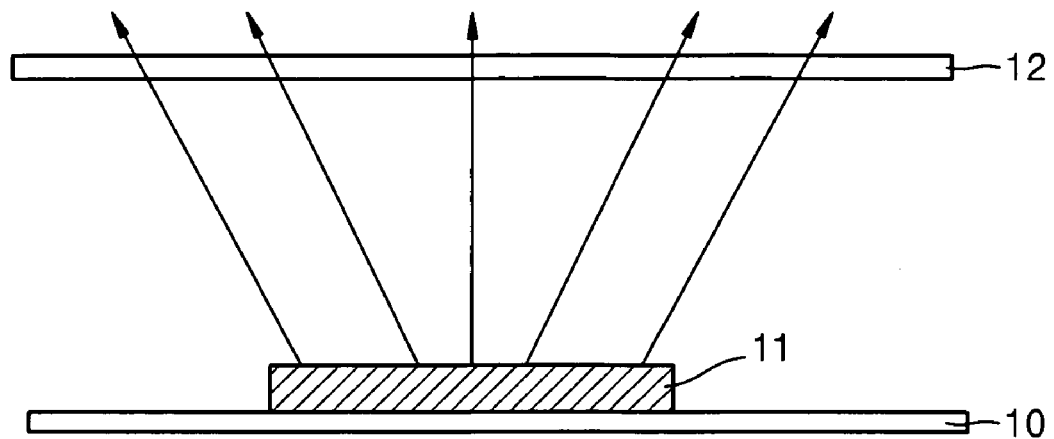
FIG. 4A is a cross-sectional view illustrating a light-diffusion state in a conventional backlight unit having no reflector sheets.
Figure 4B:
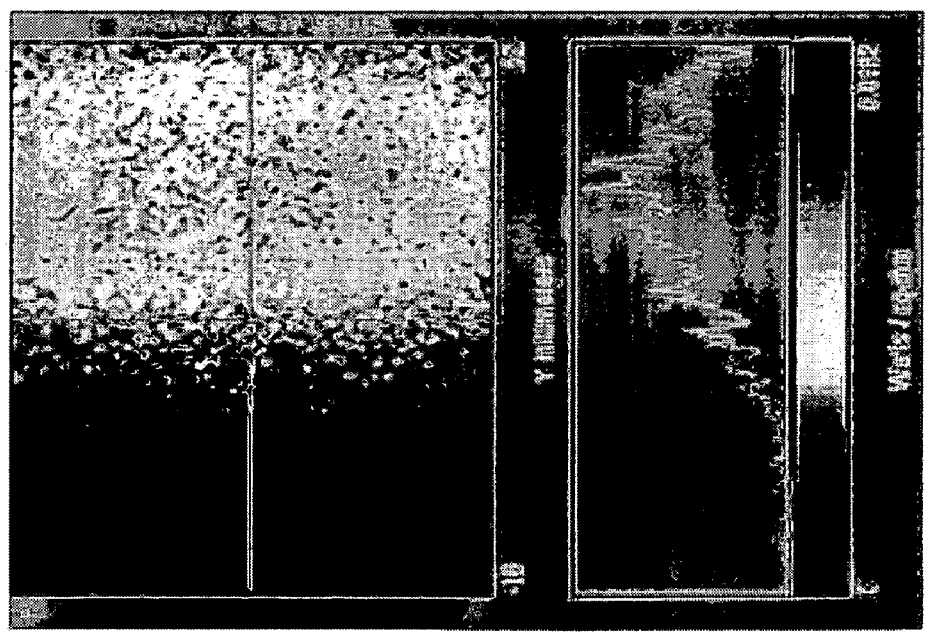
FIG. 4B illustrates the result of simulation for light uniformity of the conventional backlight unit of FIG. 4A.

In case of a direct light type of backlight unit having no reflector sheets, light emitted from the point light source 11 is radiated to side directions while the light is propagated to the diffusion panel 12, as illustrated in FIG. 4A. Accordingly, the light is diffused to adjacent areas. As illustrated in a simulation result of FIG. 4B, the backlight unit cannot accurately irradiate a target area and a light uniformity of the target area is degraded. In this case, pictures may be overlapped on the liquid crystal panel, and a blur may appear on the liquid crystal area. Additionally, the brightness of the liquid crystal panel degrades.

Figure 5A:
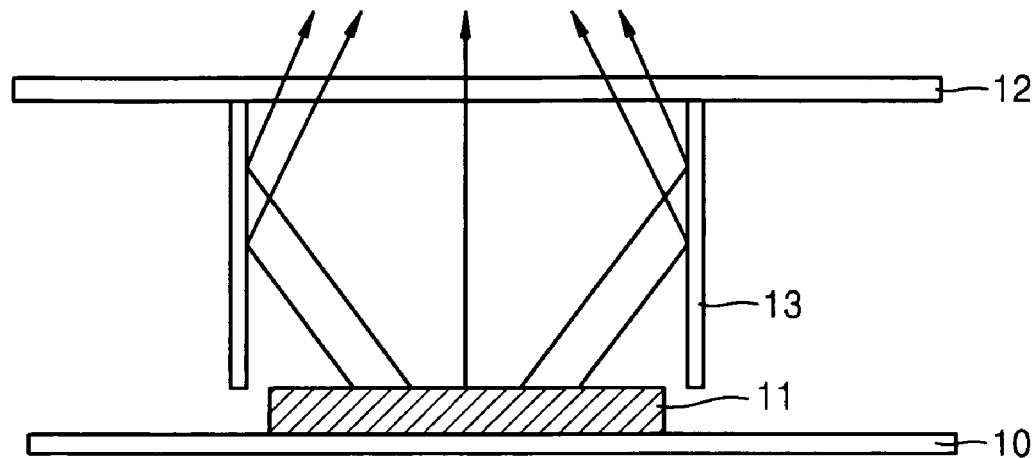
FIG. 5A is a cross-sectional view illustrating a light-diffusion state in a backlight unit having reflector sheets.
Figure 5B:
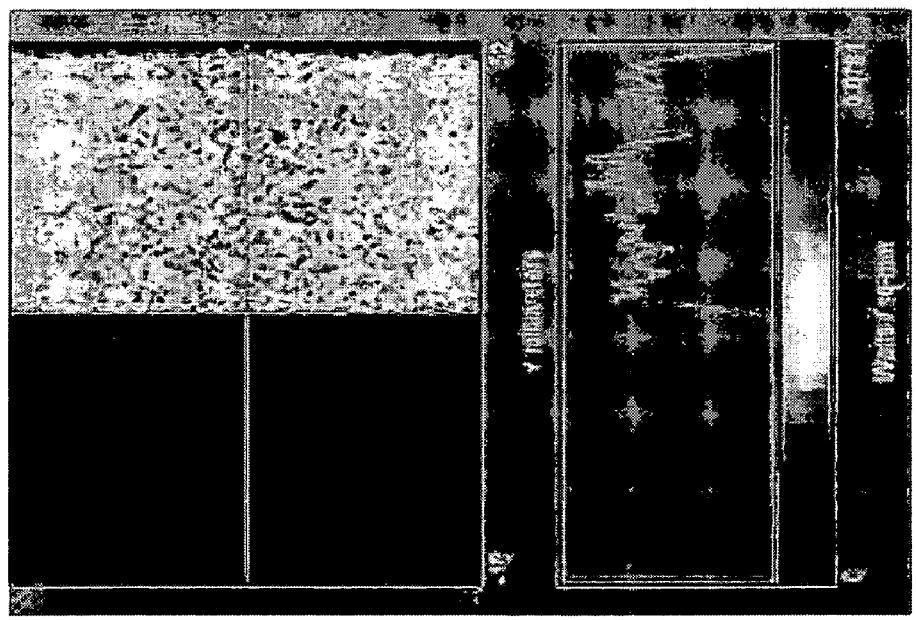
FIG. 5B illustrates the result of simulation for light uniformity of the backlight unit illustrated in FIG. 5A.

In case of using the reflector sheets 13 in the direct light type of the backlight unit as illustrated in FIG. 5A, light emitted from the point light source 11 is prevented from being diffused to adjacent areas by being reflected by the reflector sheets 13. As a result, the light emitted from the point light source is accurately irradiated onto a target area without being diffused to adjacent areas. Compared to the backlight unit without the reflector sheet, the light uniformity in the target area improves. Therefore, the problems of the conventional backlight unit are eliminated and a contrast in a screen improves.

As described above, since the backlight unit according to the present embodiment uses the LD or the LED as a light source instead of using the CCFL, the backlight unit provides superior color reproducibility and longer lifespan as compared to a conventional backlight unit. Since the backlight unit according to the present embodiment sequentially turns on the point light sources in synchronization with a screen scanning of a liquid crystal display, the motion blur is effectively eliminated. Furthermore, the uniformity of light irradiated from the point light source to the diffusion plate improves because the backlight unit according to the present embodiments is a direct light type and includes the reflector sheets between lines of point light sources. Therefore, image overlapping or screen blurring does not occur.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A backlight unit, comprising:
   a base substrate;
   a plurality of point light sources arranged in an array having a plurality of rows and a plurality of columns on a top surface of the base substrate; a diffusion plate which diffuses light emitted from the point light sources to generate a uniform transmitted light; and
   a plurality of reflector sheets which are mounted on the diffusion plate, and, vertically disposed over the top surface of the base substrate between adjacent rows of the point light sources, the plurality of reflector sheets reflecting light emitted from the point light sources to prevent light diffusion through the reflector sheet into adjacent luminance areas.

2. The backlight unit of claim 1, wherein the plurality of rows of the point light sources are sequentially turned on at predetermined time intervals.

3. The backlight unit of claim 1, wherein the rows of the point light sources are repeatedly turned on and off in a regular cycle, and one row of the point light sources is turned on after a previous row of the point light sources is turned on and a predetermined time period has elapsed.

4. The backlight unit of claim 1, wherein the point light sources emit light vertically with respect to the base substrate.

5. The backlight unit of claim 1, wherein the point light sources include red light sources, green light sources and blue light sources respectively emitting red light, green light and blue light which are mixed to emit a white light.

6. The backlight unit of claim 5, wherein the point light sources are one of laser diodes and light emitting diodes.

7. The backlight unit of claim 1, wherein the reflector sheets fully isolate each row of point light sources from adjoining rows of the point light sources.

8. The backlight unit of claim 1, wherein the reflector sheet has a high reflectivity, which prevents light diffusion through the reflector sheet into adjacent luminance areas.

9. A liquid crystal display device having a liquid crystal display panel and a backlight unit arranged at a rear of the liquid crystal display panel for radiating light onto the liquid crystal display panel, wherein the backlight unit includes:
   a base substrate;
   a plurality of point light sources arranged in an array having a plurality of rows and a plurality of columns on a top surface of the base substrate; a diffusion plate which diffuses light emitted from the point light sources to generate a uniform transmitted light; and
   a plurality of reflector sheets which are mounted on the diffusion plate, and, vertically disposed over the top surface of the base substrate between rows of the point light sources, the plurality of reflector sheets reflecting light emitted from the point light sources to prevent light diffusion through the reflector sheet into adjacent luminance areas, wherein each of the point light source row is turned in synchronizing with a screen scanning of the liquid crystal display panel.

10. The liquid crystal display device of claim 9, wherein the plurality of rows of the point light sources are sequentially turned on at predetermined time intervals.

11. The liquid crystal display device of claim 9, wherein the rows of the point light sources are repeatedly turned on and off in a regular cycle, and one row of the point light sources is turned on after a previous line of the point light sources is turned on and a predetermined time period has elapsed.

12. The liquid crystal display device of claim 11, wherein each of the point light source rows is turned on in synchronization with a screen scanning of the liquid crystal display panel.

13. The liquid crystal display device of claim 9, wherein the point light sources emit light vertically with respect to the base substrate.

14. The liquid crystal display device of claim 9, wherein the point light sources include red light sources, green light sources and blue light sources respectively emitting red light, green light and blue light which are mixed to emit a white light.

15. The liquid crystal display device of claim 14, wherein the point light sources are one of laser diodes and light emitting diodes.

16. The liquid crystal display device of claim 14, further comprising a diffusion panel which diffuses light emitted from the point light sources to generate a uniform transmitted light.

17. The liquid crystal display device of claim 9, wherein the reflector sheets fully isolate each row of the point light sources from adjoining rows of the point light sources.

18. The liquid crystal display device of claim 9, wherein the reflector sheet has a high reflectivity, which prevents light diffusion through the reflector sheet into adjacent luminance areas.

19. A backlight unit, comprising:
a base substrate;
a plurality of lines arranged as rows parallel to each other, each line being comprised of a plurality of point light sources arranged to extend along a top surface of the base substrate; a diffusion plate which diffuses light emitted from the point light sources to generate a uniform transmitted light; and
a plurality of reflector sheets which are mounted on the diffusion plate, and, vertically disposed over the top surface of the base substrate between adjacent lines, the plurality of reflector sheets reflecting light emitted from the point light sources to prevent light diffusion through the reflector plate into adjacent luminance areas.

20. The backlight unit of claim 19, wherein the reflector sheet has a high reflectivity, which prevents light diffusion through the reflector sheet into adjacent luminance areas.

* * * * *